United States Patent
Heau et al.

(10) Patent No.: US 7,182,842 B2
(45) Date of Patent: Feb. 27, 2007

(54) DEVICE FOR AMPLIFYING THE CURRENT OF AN ABNORMAL ELECTRICAL DISCHARGE AND SYSTEM FOR USING AN ABNORMAL ELECTRICAL DISCHARGE COMPRISING ONE SUCH DEVICE

(75) Inventors: Christophe Heau, Saint-Etienne (FR); Jean-Paul Terrat, Saint-Etienne (FR)

(73) Assignee: Tecmachine, Andrezieux-Boutheon (FR)

( * ) Notice: Subject to any disclaimer, the term of this patent is extended or adjusted under 35 U.S.C. 154(b) by 217 days.

(21) Appl. No.: 10/344,666

(22) PCT Filed: Jun. 10, 2002

(86) PCT No.: PCT/FR02/01975

§ 371 (c)(1),
(2), (4) Date: Aug. 11, 2003

(87) PCT Pub. No.: WO03/001560

PCT Pub. Date: Jan. 3, 2003

(65) Prior Publication Data

US 2004/0026241 A1    Feb. 12, 2004

(30) Foreign Application Priority Data

Jun. 21, 2001    (FR) .................................. 01 08184

(51) Int. Cl.
*C23C 14/35* (2006.01)
*C23C 16/00* (2006.01)

(52) U.S. Cl. ............................ 204/192.12; 204/298.06; 204/298.14; 204/298.16; 118/723 R; 118/723 MP; 118/723 E; 156/345.43; 156/345.46; 427/569; 427/571

(58) Field of Classification Search ........... 204/192.12, 204/298.06, 298.14, 298.16; 118/723 R, 118/723 MP, 723 E; 156/345.43, 345.46; 427/569, 571

See application file for complete search history.

(56) References Cited

U.S. PATENT DOCUMENTS 3,278,407 A * 10/1966 Kav ....................... 204/192.12
3,325,394 A * 6/1967 Kay et al. ............... 204/298.03
5,221,416 A * 6/1993 Kishi et al. .................... 216/71

(Continued)

FOREIGN PATENT DOCUMENTS

FR    2 534 276    4/1984

OTHER PUBLICATIONS

Kay, "Magnetic Field Effects on an Abnormal Truncated Glow Discharge and Their Relation to Sputtered Thin-Film Growth", Journal of Applied Physics, vol. 34, No. 4, Apr. 1963, pp. 760-768.*

(Continued)

*Primary Examiner*—Rodney G. McDonald
(74) *Attorney, Agent, or Firm*—Young & Thompson

(57) ABSTRACT

A device (1) for amplifying the current of an abnormal electrical discharge, characterized in that it comprises an electrode which is positively polarized (2) and associated with a magnetic circuit (3) producing a magnetic field (4) which is uniformly divergent, whereby the intensity on the surface of the electrode is more than approximately $6.10^2$ Tesla, the electrode being positioned in the region where the magnetic field is at its most intense.

24 Claims, 1 Drawing Sheet

U.S. PATENT DOCUMENTS 5,234,560 A * 8/1993 Kadlec et al. ......... 204/192.12

OTHER PUBLICATIONS

Window B et al:, "Unbalanced DC Magnetrons as Sources of High Ion Fluxes", Journal of Vacuum Science and Technology: Part A, American Institute of Physics. New York, US, vol. 4, No. 3, Part 1, May 1, 1986, pp. 453-456, XP000650364, ISSN: 0734-2101, cited in the application the whole document.

Patent Abstracts of Japan, vol. 012, No. 301 (C-521), Aug. 16, 1988 & JP 63 072870 A (Hitachi Ltd), Apr. 2, 1988 abstract.

* cited by examiner

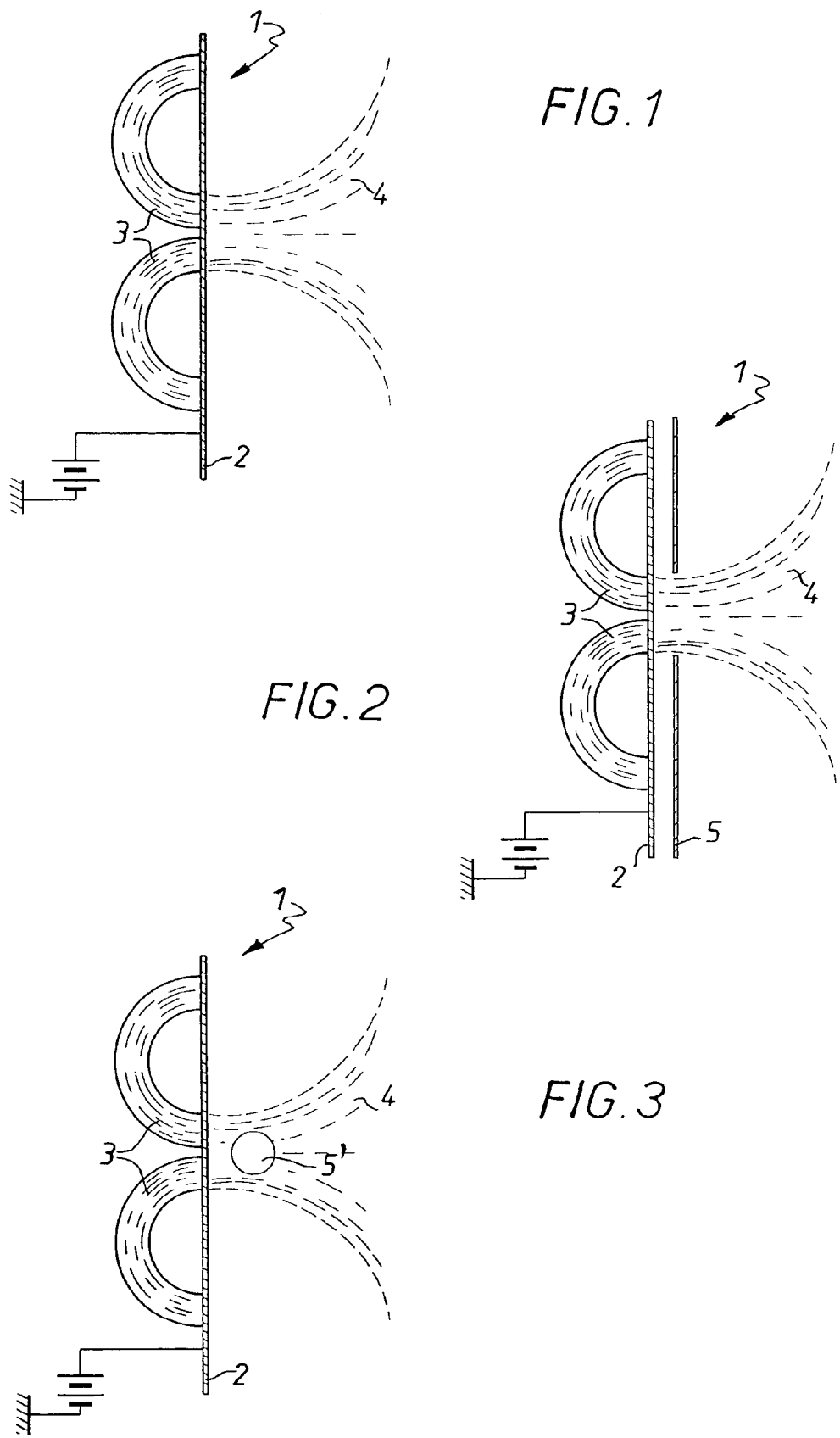

DEVICE FOR AMPLIFYING THE CURRENT OF AN ABNORMAL ELECTRICAL DISCHARGE AND SYSTEM FOR USING AN ABNORMAL ELECTRICAL DISCHARGE COMPRISING ONE SUCH DEVICE

BACKGROUND OF THE INVENTION

The present invention relates to a device for amplifying the current of an abnormal electrical discharge and a system for using an abnormal electrical discharge comprising one such device.

The invention relates to all devices for using the current of an abnormal electrical discharge, also known as a luminescent discharge, further known as a cold plasma, in particular for making deposits on, treating and modifying the surface of a metal or non-metal substrate.

Luminescent discharges are increasingly used as a material and/or energy transfer medium in many surface modification processes; processes for coating metal or non-metal parts may be cited, and among these magnetron cathode sputtering, plasma-enhanced chemical deposition, assisted thermochemical treatment processes such as post-discharge (deferred plasma) or ionic nitriding, ionic etching processes, plasma cleaning, etc. These techniques are used in most industrial fields, especially microelectronics, but also optics and mechanical engineering.

Luminescent discharges (cold plasmas) comprise a plurality of types of electrical discharge, each type having specific characteristics. The person skilled in the art refers to the electrical discharges to which the invention relates as "abnormal discharges"; they are characterized by the fact that in their domain of existence the current varies as a monotonous function of the excitation voltage.

Devices for using the current of an abnormal electrical discharge to treat a substrate (the term "treat" is to be understood as encompassing deposition on and modification of the surface of said substrate) generally comprise an enclosure in which a vacuum can be established, since these discharges occur only at reduced pressure, a system comprising an electrode (cathode) and an electrical power supply to generate the discharge, and a substrate carrier designed to support the substrates to be treated. The current flowing through the substrate defines the number of ions that bombard it per unit time (ionic current), and the voltage defines the energy of those ions. These two parameters are important parameters for most processes.

One constraint imposed on such devices is the interdependence of the voltage and the ionic current.

Attempts to increase the ionic current are the outcome of seeking to improve the efficiency of the treatment. At low currents, this can be achieved only by increasing the voltage.

However, increasing the voltage can quickly become a problem, as ions with too much energy can create unwanted modifications of the surface of the substrate to be treated, coated or modified.

For example, a number of systems have been described for increasing the flux of ions impinging on the substrates to be treated when the magnetron cathode sputtering technique is used. The most widely used is the unbalanced magnetron cathodes technique. The magnetic configuration of the system forces the energetic electrons fleeing the magnetic trap of the cathode to converge toward the substrate, where they increase the ionization of the gas. The flux of ions obtained depends on the characteristics of the electrical discharge. Such systems have been developed in particular by B. Window (see the papers by B. Window and N. Savvides, J. Vac. Sci. Technol. A 4 (3) May/June 1986, pages 453–456 "Unbalanced dc magnetrons as sources of high fluxes" and J. Vac. Sci. Technol. A 4 (2) March/April 1986, pages 196–202 "Charged particle fluxes from planar magnetron sputtering sources").

Devices for amplifying the current of an unbalanced magnetron cathodes electrical discharge cannot increase the ionic current on the substrate without in parallel increasing the ion acceleration voltage.

Systems have also been developed using auxiliary systems, for example from magnetron cathodes to microwave excited plasma systems.

Systems have also been developed using a filament and a hollow cathode.

Such systems are not in widespread use today, mainly because they are difficult to use and unreliable.

Furthermore, the prior art systems cannot, without great difficulty if at all, be produced with different geometries and different sizes, in order to cater for a large number of industrial configurations.

SUMMARY OF THE INVENTION

One object of the invention is to provide a system for using the current of an abnormal electrical discharge for treating a substrate which increases the ionic current on the substrate without in parallel increasing the ion acceleration voltage.

Another object of the invention is to provide a system that is reliable and easy to use for using the current of an abnormal electrical discharge to treat a substrate.

A further object of the invention is to provide a system for using the current of an abnormal electrical discharge that can easily be implemented in a plurality of generic geometries, for example circular or rectangular, and with various dimensions.

Other objects and advantages of the invention will become apparent on reading the following description.

To meet the above objects, the present invention provides a system for using an abnormal electrical discharge which includes a plasma source and is characterized in that it includes a new auxiliary device. The auxiliary device is based on using combined electric and magnetic fields which, coupled with a plasma source, considerably increases the ionic current on the substrates independently of the ion acceleration voltage. A device of the above kind is referred to hereinafter as a device for amplifying the current of an abnormal electrical discharge, an ionic amplifier or a plasma amplifier.

A device in accordance with the invention for amplifying the current of an abnormal electrical discharge is characterized in that it comprises an electrode which is positively polarized and associated with a magnetic circuit producing a magnetic field which is uniformly divergent, whereby the intensity on the surface of said electrode is more than approximately $6.10^{-2}$ Tesla, said electrode being positioned in the region where the magnetic field is most intense.

The magnetic field is measured at the surface and at the center of the ionic amplifier.

The magnetic field preferably has an intensity from approximately $8.10^{-2}$ Tesla to approximately $25.10^{-2}$ Tesla and even more preferably from approximately $10.10^{-2}$ Tesla to approximately $15.10^{-2}$ Tesla.

Too low a magnetic field produces an unstable plasma whereas too high a magnetic field can be dangerous without being more effective.

The magnetic circuit can be made up of permanent magnets and/or electromagnets, for example.

The dimensions of the device in accordance with the present invention for amplifying the current of an electrical discharge are related to the configuration of the utilization system in which it is installed. The positively polarized electrode can be a disk whose diameter is from approximately 50 mm to approximately 200 mm, for example.

More generally, the positive electrode has a rectangular shape whose width is from approximately 50 mm to approximately 200 mm and whose height is from approximately 200 mm to approximately 1000 mm, for example.

Although this is not limiting on the invention, the plasma amplifier preferably includes a metal counter-electrode for stabilizing the plasma.

The counter-electrode is a metal component that can be either connected to ground or biased to a voltage from 0 to approximately −200 V relative to ground.

The counter-electrode is positioned on the path of the electrical discharge.

The person skilled in the art will readily be able to determine the position of the counter-electrode.

The counter-electrode must be substantially parallel to the surface of the amplifier, preferably at a distance from approximately 5 mm to approximately 70 mm from the surface of the positively polarized electrode of said amplifier.

The counter-electrode can comprise a plate incorporating an orifice, for example a rectangular hole. The person skilled in the art will understand that the dimensions of the orifice must be such that the divergent magnetic field lines are not intercepted by the plate.

The counter-electrode can instead comprise a grid.

Finally, the counter-electrode can instead comprise a rod, for example a rod with a diameter from 5 mm to 20 mm. In this case the rod is advantageously parallel to the central magnetic pole.

Depending on the embodiment of the invention, it may be necessary to combine more than one type of counter-electrode in the same amplifier.

The device in accordance with the invention for amplifying the current of an electrical discharge can include a plurality of counter-electrodes of different types or the same type.

The counter-electrodes can be of the plate type, of the rod type, of the disk type, of the rectangular type or of the grid type, for example.

The present invention also provides a system for using an abnormal electrical discharge, including a plasma source in an enclosure containing a gas at reduced pressure, characterized in that it includes in said enclosure a device in accordance with the invention as described above for amplifying the current of an electrical discharge.

The plasma sources are also referred to as "primary sources".

The system according to the invention can include a plurality of plasma sources. In this case, the system includes a plurality of devices for amplifying the current of an electrical discharge. Although this is not limiting on the invention, each of the devices for amplifying the current of an electrical discharge is preferably associated with only one plasma source.

The system according to the invention for using an electrical discharge can be used to make a deposit on, treat or modify the surface of a substrate, for example. These uses are referred to by the generic term "treatment" in the description.

In a preferred embodiment of the invention the plasma source or at least one of the plasma sources is a magnetron cathode sputtering cathode.

In this embodiment, if the positively polarized electrode of the device for amplifying the current of an electrical discharge is rectangular, the length of the positively polarized electrode must be substantially the same as that of the magnetron cathode, in order to obtain a homogeneous plasma in the treatment area.

A system according to the invention for using an abnormal electrical discharge generally includes a rotatable substrate carrier designed to support the parts to be treated. The substrate carrier can itself be negatively polarized to accelerate the positive ions emanating from the source and thus bombard the substrate.

The disposition of the device for amplifying the current of an abnormal electrical discharge (plasma amplifier) must be such that the amplified plasma diffuses toward the substrate carrier. Also, it is preferable to minimize the distance between the primary source and the plasma amplifier. Accordingly, in small deposition machines (diameter<400 mm), the dimensions are sufficiently small to position the plasma amplifier anywhere provided that the substrate carrier does not screen in a penalizing manner the electrons emanating from the primary source. In larger machines (diameter>400 mm), the plasma amplifier is advantageously disposed at a distance of less than 400 mm from the primary source and this distance is preferably reduced to the minimum permitted by the mechanical construction. This configuration allows satisfactory operation of the plasma amplifier because the concentration of electrons emanating from the source is sufficient to ignite the amplified plasma. Also, this configuration minimizes interaction with the substrate carrier. The electrons can then pass directly from the source to the device for amplifying the current of an electrical discharge.

As a general rule, the direction of the magnetic polarity of the device for amplifying the current of an electrical discharge has no significant effect on its effectiveness. However, when the source uses devices based on magnetic fields to generate the plasma, the magnetic polarity of the amplifier must be adjusted relative to the primary source, especially if the primary source is a magnetron cathode sputtering cathode. The central pole of the magnetron cathode and the device for amplifying the current of an electrical discharge must preferably have the same sign, so that no looping of field lines is possible between the cathode and the device for amplifying the current of an electrical discharge. It is increasingly important to comply with this feature if the distance between the device for amplifying the current of an electrical discharge and the magnetron cathode decreases (d<200 mm). If the distance is large (from 200 mm to 400 mm), the direction of the magnetic polarity is no longer important, because the interaction of the magnetic fields is then negligible.

The present invention further provides a method of treating parts (substrates) with a plasma, characterized in that it uses the system described above for using an abnormal electrical discharge.

In a method according to the invention, the electrical power supply which supplies power to the device for amplifying the current of an electrical discharge must have a minimum voltage for the amplification mechanism to be initiated. The positive voltage must be sufficient (in practice greater than approximately 20 V) for the electrons to be able to ionize the gas. When amplification commences, the positive voltage of the amplifier changes very little when the imposed current changes over a large range. Depending on what is required, the power supply can provide a direct current or a current chopped at a low, medium or high frequency. If the source is a magnetron cathode sputtering cathode, the maximum current imposed on the plasma amplifier must not exceed 1.5 times that of the source, regardless of the mode of polarization of the latter. Beyond 1.5 times the cathode current, the amplified plasma becomes very unstable and generates electrical arcs on the various components of the deposition system, and the voltage of the amplifier begins to increase greatly (greater than approximately 60 V) and fluctuates intensely. Moreover, if the voltage of the plasma amplifier becomes too high (>60 V), the walls of the deposition machine begin to be pulverized, which degrades the quality of the process.

A second feature of the method according to the invention is consequently that the supply voltage of the device for amplifying the current of an electrical discharge must be from approximately 20 volts to approximately 60 volts.

The plasma amplifier according to the invention has many advantages. In particular, the plasma amplifier increases the ionic current on the substrate carrier by a factor from 1 to 10 compared to the current normally obtained with conventional magnetron cathode sputtering. The factor depends on the current imposed on the amplifier (from 0 to 1.5 times the cathode current).

The invention also has other advantages that are particularly beneficial for the user: the ionic current from the plasma amplifier can be adjusted independently of that from the primary source. Also, the bias voltage and the current of the substrate carrier can be adjusted independently, so that it is possible to control independently the number and the energy of the ions bombarding the substrate.

BRIEF DESCRIPTION OF THE DRAWINGS

The invention is described in more detail next, but without limiting the invention, with reference to the accompanying drawings, in which:

FIG. 1 is a diagrammatic view of a device according to the invention for amplifying the current of an abnormal electrical discharge, FIG. 2 is a diagrammatic view of an embodiment of a device according to the invention for amplifying the current of an abnormal electrical discharge including a counter-electrode in the form of a plate, and FIG. 3 is a diagrammatic view of an embodiment of a device according to the invention for amplifying the current of an abnormal electrical discharge including a counter-electrode in the form of a rod.

DESCRIPTION OF THE PREFERRED EMBODIMENTS

Referring to FIG. 1, the device 1 in accordance with the invention for amplifying the current of an abnormal electrical discharge includes a rectangular electrode 2 which is positively polarized, associated with a magnetic circuit 3 producing a magnetic field 4 which is uniformly divergent, whereby the intensity on the surface of said electrode is more than approximately $6.10^{-2}$ Tesla. The electrode 2 is positioned in the region where the magnetic field 4 is most intense.

Referring to FIG. 2, the device 1 according to the invention for amplifying the current of an electrical discharge further includes a metal counter-electrode 5 in the shape of a plate positioned on the path of the electrical discharge and substantially parallel to the surface of the amplifier device 1.

Referring to FIG. 3, the device 1 according to the invention for amplifying the current of an electrical discharge further includes a metal counter-electrode 5' in the form of a rod positioned on the path of the electrical discharge and substantially parallel to the surface of the amplifier device 1.

The following example serves to illustrate the invention without limiting it.

EXAMPLE

In a 350 mm diameter vacuum deposition machine, a 150 mm diameter magnetron cathode is installed and supplied with a power of 1800 W at a voltage of 550 V (3.3 A). The plasma amplifier receives a supply current of 4 A. The rotating substrate carrier is biased to a voltage of −100 V. The bias current Ib is measured.

The magnetic field at the surface of the amplifier is $11.10^{-2}$ Tesla.

The electrode is a 150 mm diameter disk.

The ion acceleration voltage V is measured with and without the plasma amplifier according to the invention (configuration 0 and configuration 1, respectively).

The efficacy of the system is characterized by the factor k, the ratio of the current $Ib_A$ collected on the parts when the plasma amplifier is operating and the current Ib received when there is no plasma amplifier.

The results are indicated in Table I below.

TABLE I

| Configuration | Plasma amplifier present | k = $Ib_A$/Ib | V in volts on substrate carrier |
|---|---|---|---|
| 0 (comparative) | No | 1 | −100 |
| 1 | Yes | 6.2 | −100 |

Note that the plasma amplifier according to the invention increases the ionic current on the substrate without in parallel increasing the ion acceleration voltage V.

The person skilled in the art will understand that although the invention has been described and shown by means of particular embodiments, numerous variants can be envisaged without departing from the scope of the invention as defined in the accompanying claims.

The invention claimed is:

1. A device (1) for amplifying the current of an abnormal electrical discharge,
   wherein the device is arranged to amplify the current of the abnormal electrical discharge at a substrate being treated and includes an electrode disk (2) which is positively polarized and associated with a magnetic circuit (3) producing a magnetic field (4) which is uniformly divergent, whereby the intensity on the surface of said electrode is more than approximately $6.10^{-2}$ Tesla, said electrode being positioned in the region where the magnetic field is most intense.

2. A device (1) according to claim 1 for amplifying the current of an abnormal electrical discharge, characterized in that the magnetic field (4) has an intensity from approximately $8.10^{-2}$ Tesla to approximately $25.10^{-2}$ Tesla.

3. A device (1) according to claim 2 for amplifying the current of an abnormal electrical discharge, characterized in that the magnetic field (4) has an intensity from approximately $10.10^{-2}$ Tesla to approximately $15.10^{-2}$ Tesla.

4. A device (1) according to claim 1 for amplifying the current of an abnormal electrical discharge, characterized in that the disk has a diameter from approximately 50 mm to approximately 200 mm.

5. A device (1) for amplifying the current of an abnormal electrical discharge,
wherein the device includes an electrode (2) which is positively polarized and associated with a magnetic circuit (3) producing a magnetic field (4) which is uniformly divergent, whereby the intensity on the surface of said electrode is more than approximately $6.10^{-2}$ Tesla, said electrode being positioned in the region where the magnetic field is most intense, and a metal counter-electrode (5, 5') positioned on the path of the electrical discharge and substantially parallel to the surface of said electrode.

6. A device (1) according to claim 5 for amplifying the current of an abnormal electrical discharge, characterized in that the counter-electrode (5, 5') is positioned at a distance from approximately 5 mm to approximately 70 mm from the surface of the positively polarized electrode of said amplifier device.

7. A device (1) according to claim 5 for amplifying the current of an abnormal electrical discharge, characterized in that the counter-electrode is a plate.

8. A device (1) according to claim 7 for amplifying the current of an abnormal electrical discharge, characterized in that the plate has an orifice through it.

9. A device (1) according to claim 8 for amplifying the current of an abnormal electrical discharge, characterized in that the orifice is rectangular.

10. A device (1) according to claim 5 for amplifying the current of an abnormal electrical discharge, characterized in that the counter-electrode is a rod.

11. A device (1) according to claim 10 for amplifying the current of an abnormal electrical discharge, characterized in that the rod has a diameter from approximately 5 mm to approximately 20 mm.

12. A device (1) according to claim 5 for amplifying the current of an abnormal electrical discharge, characterized in that the counter-electrode is a disk.

13. A device (1) according to claim 5 for amplifying the current of an abnormal electrical discharge, characterized in that the counter-electrode is rectangular.

14. A device (1) according to claim 5 for amplifying the current of an abnormal electrical discharge, characterized in that the counter-electrode is a grid.

15. A device (1) according to claim 5 for amplifying the current of an abnormal electrical discharge, characterized in that it includes a plurality of counter-electrodes.

16. A device (1) according to claim 15 for amplifying the current of an abnormal electrical discharge, characterized in that the counter-electrodes are of different types.

17. A device (1) according to claim 16 for amplifying the current of an abnormal electrical discharge, characterized in that the counter-electrode types are chosen from the plate type, the rod type, the disk type and the grid type.

18. A system for using an abnormal electrical discharge, including a plasma source in an enclosure containing a gas at a reduced pressure, wherein the system includes in said enclosure a device according to claim 1 that is separate from said enclosure and said plasma source.

19. A system according to claim 18 for using an abnormal electrical discharge, characterized in that it includes a device for amplifying the current of an abnormal electrical discharge for the plasma source or for each plasma source, the or each device for amplifying the current of an electrical discharge being associated with only one plasma source.

20. A system according to claim 18 for using an abnormal electrical discharge, characterized in that at least one of the plasma sources is a magnetron cathode sputtering cathode.

21. A system according to claim 18 for using an abnormal electrical discharge, characterized in that said use is chosen from deposition on and treatment and modification of the surface of a substrate.

22. A system according to claim 21 for using an abnormal electrical discharge, characterized in that it is associated with a rotatable substrate carrier.

23. A system according to claim 22 for using an abnormal electrical discharge, characterized in that the substrate carrier is negatively polarized.

24. A method of treating the substrate with a plasma, characterized in that a system according to claim 18 for using an abnormal electrical discharge is used and in that the positive supply voltage of the device for amplifying the current of an abnormal electrical discharge is from approximately 20 volts to approximately 60 volts.

* * * * *